(12) United States Patent
Moller

(10) Patent No.: US 6,515,235 B2
(45) Date of Patent: Feb. 4, 2003

(54) LIQUID DIELECTRIC TUNING OF AN INTEGRATED CIRCUIT

(75) Inventor: Thomas W. Moller, Gilroy, CA (US)

(73) Assignee: Ericsson, Inc., Plano, TX (US)

(*) Notice: Subject to any disclaimer, the term of this patent is extended or adjusted under 35 U.S.C. 154(b) by 0 days.

(21) Appl. No.: 09/871,374

(22) Filed: May 30, 2001

(65) Prior Publication Data

US 2002/0179321 A1 Dec. 5, 2002

(51) Int. Cl.[7] .................................................. H05K 1/09
(52) U.S. Cl. ........................ 174/256; 174/255; 333/205; 361/277; 361/327
(58) Field of Search ................................. 174/255, 256, 174/257, 258; 361/327, 321.1; 333/204, 205, 246; 301/277

(56) References Cited

U.S. PATENT DOCUMENTS

| | | | |
|---|---|---|---|
| 4,108,788 A | 8/1978 | Schulz et al. ................... 585/19 |
| 4,111,825 A | 9/1978 | Schulz et al. ................... 585/24 |
| 4,142,983 A | 3/1979 | Jay et al. ........................ 336/94 |
| 4,152,043 A | * 5/1979 | Albanese ....................... 385/22 |
| 4,450,500 A | 5/1984 | Wollenschläger ............ 361/277 |
| 5,162,972 A | * 11/1992 | Gripshover et al. ......... 361/277 |
| 5,304,966 A | * 4/1994 | Hino et al. ................... 333/204 |
| 5,777,526 A | 7/1998 | Kawasaki ....................... 333/1 |
| 6,097,097 A | * 8/2000 | Hirose .......................... 257/778 |
| 6,185,087 B1 | * 2/2001 | Park et al. ................ 361/321.4 |

* cited by examiner

Primary Examiner—Albert W. Paladini
(74) Attorney, Agent, or Firm—Bingham McCutchen LLP

(57) ABSTRACT

A desired performance characteristic of an electrical circuit employing a strip conductor is achieved by placing a fluid having a selected dielectric property in contact with at least a portion of the strip conductor, such that the dielectric property of the fluid effects one or more transmission characteristics of the conductor. In one embodiment, the circuit performance is measured and the dielectric property of the fluid adjusted, e.g., in an iterative process, until the desired performance characteristic of the circuit is achieved.

14 Claims, 2 Drawing Sheets

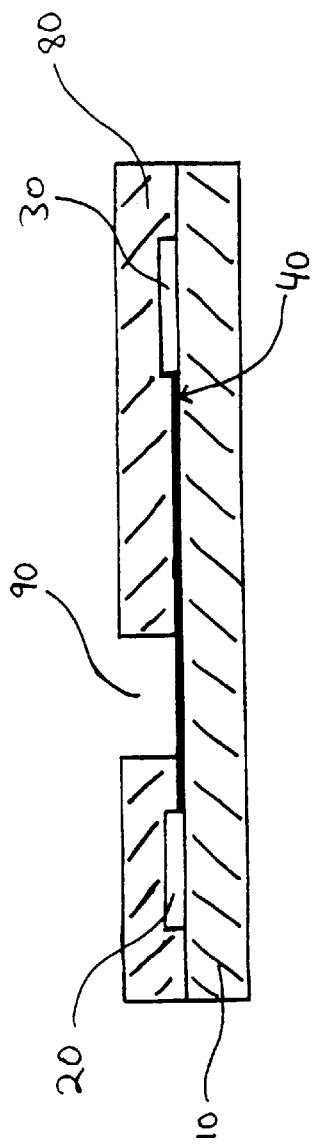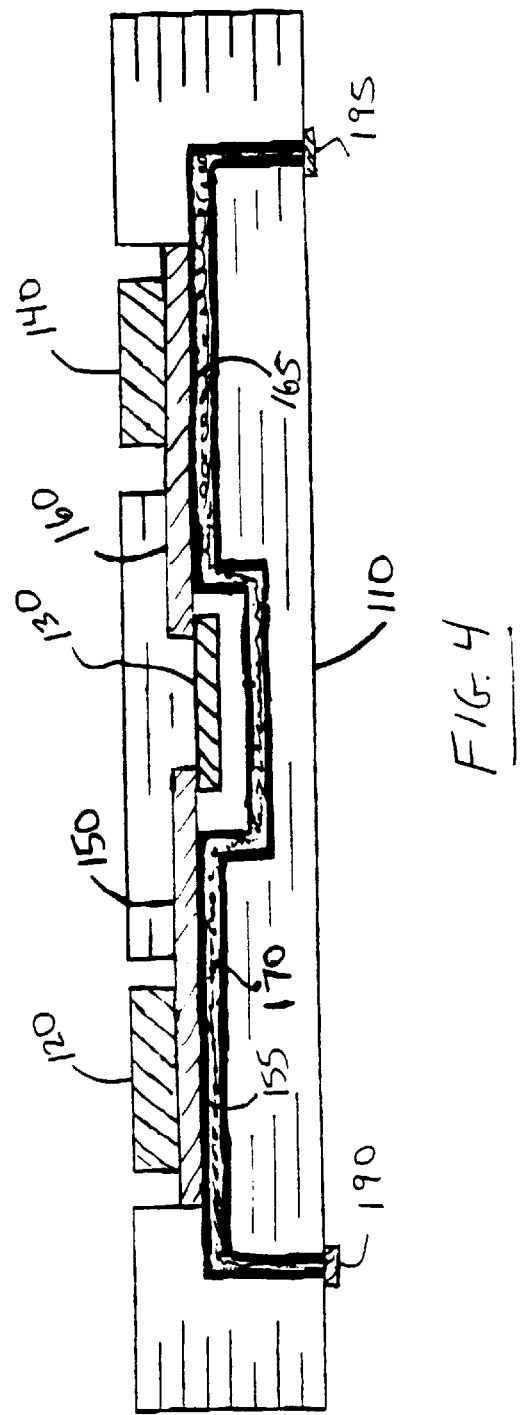

LIQUID DIELECTRIC TUNING OF AN INTEGRATED CIRCUIT

BACKGROUND OF THE INVENTION

1. Field of the Invention

The present invention pertains generally to the field of circuit design and manufacture and, more particularly, to methods for tuning high frequency circuits, such as radio frequency (RF) power amplifier circuits, employing conductive layer strip leads and connectors.

2. Background

In many high frequency circuit applications that require impedance matching, such as RF power amplifier circuits, conventional wire connection technology cannot be used. Instead, conductive metal layers, or "strip conductors" are used for electrical connection of circuit elements. As used herein, a "strip line" conductor is a conductive layer strip "sandwiched" between two dielectric layers, whereas a "micro strip" conductor is a conductive layer strip disposed on a dielectric layer and exposed to the environment, i.e., an "open faced" sandwich. The use of micro strip and strip line conductors is well known in the art.

In the manufacture of high speed integrated circuit packages, it is often necessary to tune certain component values and circuit performance characteristics after assembly, such as, e.g., transmission or delay times, capacitance, inductance, wavelengths, and/or power losses. Known in the art are various forms of destructive tuning, e.g., laser trimming of resistors. However, destructive tuning can be ineffective, especially where it must be performed before it is known whether a particular circuit element or integrated circuit die will perform as intended.

It is also known in the art that varying the dielectric constant of the dielectric insulating layer(s) in micro strip and strip line conductors affects various electrical properties of the signal being carried thereon. For example, U.S. Pat. No. 5,777,526 to Kawasaki describes a technique of adjusting the transmission delay time per unit length of one strip conductor relative to another by disposing a dielectric layer under the first conductor having a different dielectric constant than a dielectric layer under the second conductor. However, changing a dielectric layer after assembly involves a significant expense, if it is even possible, as it must be removed and replaced on the circuit. Further, any components or conductors attached to the dielectric layer to be removed must also be replaced.

SUMMARY OF THE INVENTION

In accordance with one aspect of the invention, a performance characteristic of an electrical circuit employing a strip conductor is achieved by placing a fluid having a selected dielectric property in contact with at least a portion of the strip conductor, such that a dielectric property of the fluid effects one or more transmission characteristics of the conductor. In one embodiment, the performance characteristic is measured, and the dielectric property of the fluid adjusted, respectively, in an iterative process, until the desired performance characteristic of the circuit is achieved.

In preferred embodiments, the strip conductor may comprise either micro strip or strip line type conductors. In one embodiment employing a strip line conductor, one or more portions of an insulating layer are removed from the strip line conductor to expose the conductive strip to the dielectric liquid. In one embodiment, in which a multilayer printed circuit board (PCB) is used as a carrier platform for the circuit, one or more access channels are formed through the PCB layers, proving for contact between the dielectric fluid and portions of a plurality of respective conductors located within the PCB.

Other and further aspects and advantages of the invention will become apparent in view of the following detailed description of the preferred embodiments.

BRIEF DESCRIPTION OF THE DRAWINGS

Preferred embodiments are illustrated by way of example, and not by way of limitation, in the figures of the accompanying drawings, in which like reference numerals refer to like components, and in which:

FIG. 3 is a cross-sectional view taken of an alternate integrated circuit package constructed in accordance with the invention.

FIG. 4 a cross-sectional diagram of an electrical circuit embodied in a multilayer PCB having a dielectric fluid channel for tuning conductors of the circuit embedded in the PCB.

DETAILED DESCRIPTION OF THE PREFERRED EMBODIMENTS

Figure 1:
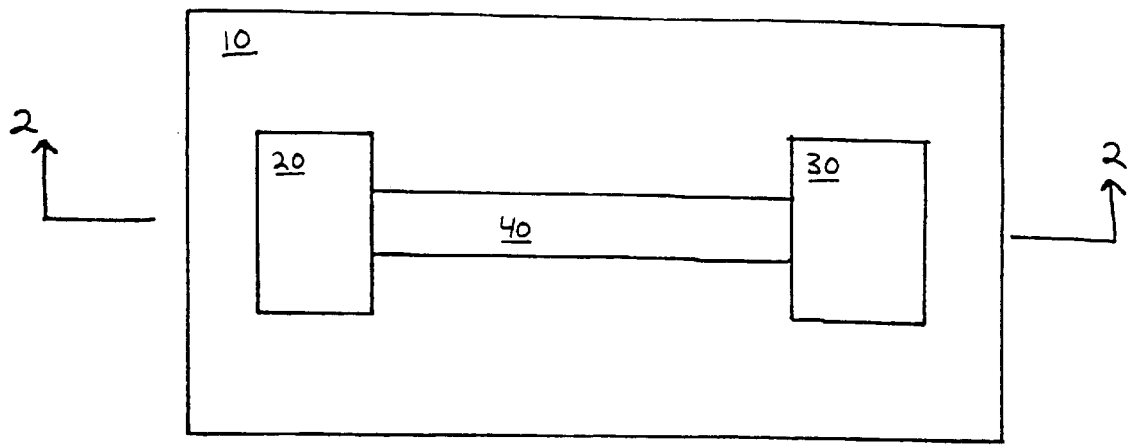
FIG. 1 is a planar top view of an integrated circuit package constructed in accordance with the invention.

An exemplary PCB carrying an electrical circuit is shown in FIG. 1. The PCB 10 comprises an insulating layer 10. A pair of circuit components 20 and 30 are attached to the substrate 10. A strip conductor 40 electrically connects the components 20 and 30 to each other. Notably, the components 20 and 30 can any known electrical components, such as (by way of non-limiting examples) resistors, capacitors, transistors or diodes. Also, the components 20 and 30 may comprise a single element or a complete integrated circuit or even an integrated circuit package. For example, one component could be a RF power transistor package.

The insulating layer 10 is made of a dielectric material and has a selectable dielectric constant. Various dielectrics may be used, depending on the application. Some typical dielectrics (with their dielectric constants in parentheses) that may be appropriate include polytetrafluoroethylene (2.4), glass epoxy (4.4–5.0), alumina composite (5.0–10.0), and alumina ceramic (9.0–10.0). A wide range of possible dielectrics are available.

The conducting strip 40 is attached to the insulating layer 10 and carries an electrical signal (or signals) between the components 20 and 30. The conducting strip 40 may be, e.g., a copper or nickel layer that can be formed by any of the various techniques known in the art, such as plating, sputtering, and evaporation. In one embodiment (shown in FIG. 2), a ground plane conductor 50 may be attached to a bottom surface of the insulating layer 10, whereby the ground plane conductor 50, insulating layer 10, and conducting strip 40 collectively form a microwave transmission line.

Figure 2:
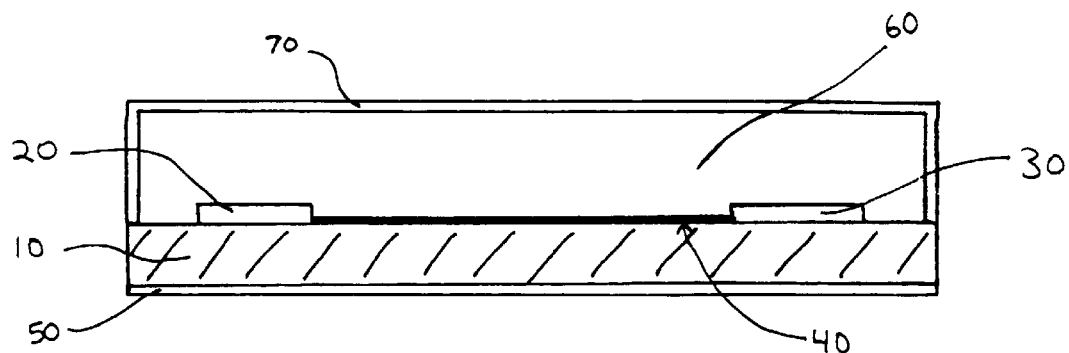
FIG. 2 is a cross-sectional view of the integrated circuit device of FIG. 1, taken along the line 2—2.

In the embodiment of FIG. 2, the conducting strip 40 is exposed. It is well known in the art that the dielectric constant of a region surrounding a conducting strip 40 affects the propagation of an electrical signal (or energy) along the conductor 40. Also, the dielectric constant of a material affects the energy fields therein, which in turn changes capacitance values in that region. It will be appreciated, therefore, that various electrical performance characteristics of an electrical circuit including the conducting strip 40 may be adjusted by changing the dielectric surrounding the conducting strip 40. For example, changing the dielectric constant in the volume over the conducting strip 40 may affect the delay time transmission of a signal to be transmitted over the strip 40, the wavelength in the dielectric, or an inductance or capacitance value. The delay time error caused by dispersion in the characteristics of digital circuit elements mounted on a micro strip transmission line or by a design error could also be corrected by varying the dielectric constant.

Towards this end, in accordance with one aspect of the invention, a dielectric fluid 60 (which can be a gas or a liquid) is provided for adjusting the dielectric constant in a region proximate to the conducting strip 40. The dielectric fluid 60 is chosen, in part, for its dielectric properties, e.g., its dielectric constant. The desired dielectric properties of the fluid 60 are determined according to the desired electrical performance characteristics of the circuit, as described above. For example, the dielectric constant of the fluid 60 may be established as part of a circuit tuning process.

In one embodiment, an electrical performance characteristic of the circuit is measured before or after the dielectric fluid is placed in contact with the conductor 40, and the dielectric value of the fluid 60 is selected according to a calculation based on known relationships between the dielectric constant and the transmission characteristics of the conductor 40 (and, of course, on the relationship between the transmission characteristics and the circuit performance). This may include an iterative process between measuring the circuit performance and varying the dielectric constant until a desired electrical performance characteristic of a circuit including conductor 40 is achieved. This process can be performed by flushing out the dielectric fluid 60 and replacing it with a new one. Alternatively, the dielectric fluid 60 can be mixed with another fluid, e.g., of higher or lower dielectric value, as needed. These steps can be repeated until the measured electrical characteristic equals the desired electrical characteristic within a predetermined tolerance. In this way, the circuit can be precisely tuned without destroying it or replacing any part other than the fluid.

When a conducting strip 40 has an insulating layer 10 on one side and is exposed on the other side (or at least a portion thereof), the result is a discontinuity of dielectric along the surface area of the conducting strip 40. It is known in the art that such a discontinuity can result in greater, or at least different, power loss. This is one known disadvantage of a micro strip conductor over a strip line conductor. In some applications, therefore, it is desirable to have a uniform dielectric structure, in which the conductor 40 is surrounded by the same dielectric constant, to minimize this loss. To achieve this object, the dielectric constant of the dielectric fluid 60 can be selected to match the dielectric constant of the insulating layer 10 within a predetermined tolerance.

As shown in FIG. 2, to maintain the dielectric liquid 60 proximate to the conductor 40, a cover 70 may be attached to enclose the PCB 10. The cover 70 would be attached to the side of the PCB 10 where it is desired to place the dielectric fluid 60, i.e., forming a fluid reservoir between the PCB 10 and the cover 70. The cover 70 and PCB 10 should form an environmental seal that would contain the dielectric fluid 60 therein without leaking.

In another embodiment, shown in FIG. 3, a second insulating layer 80 is attached to the first insulating layer 10, sandwiching the conducting strip 40 and components 20 and 30, respectively. In this embodiment, a portion of the conducting strip 40 is covered by the second insulating layer 80, and a portion of the second insulating layer 80 is removed to expose a portion 90 of the conducting strip 40. One or more electrical characteristics of the circuit may be adjusted by placing a dielectric fluid 60 having a desired dielectric constant in contact with the exposed portion 90.

Preferably, the exposed portion 90 is formed near electrically sensitive parts of the circuit, such as areas of low impedance or where high frequency signals propagate. Also, depending on the design of the circuit, more than exposed portion 90 of the conductive strip 40 may be exposed to the dielectric fluid 60, and each exposed portion may expose a different surface contact area between the conductive strip 40 and fluid 60. In multilayer PCBs, for example, the fluid 60 may be contained in one or more channels formed between layers of the PCB.

U.S. Pat. No. 6,099,677 to Logothetis et al., which is fully incorporated by reference herein, discloses a circuit package platform for multilayer integrated circuits in which the inventive concepts disclosed herein are well-suited. A manufacturing process disclosed therein involves bonding fluoropolymer composite substrates into a multilayer structure using fusion bonding. The bonded layers, with embedded semiconductor devices, etched resistors and circuit patterns, and plated via holes form a self-contained, surface mountable module. Such a module may be readily designed, e.g., on a layer by layer basis, to include various dielectric liquid flow channels and cavities, which provide for placing the liquid in contact with the various internal components and transmission elements.

By way of further illustration, FIG. 4 depicts a circuit 100 embedded in a multilayer PCB 110. The circuit 100 includes a plurality of electrical components, 120, 130 and 140, which may be, e.g., resistors, capacitors, transistors, diodes or the like. The components 120, 130 and 140 may also be fully integrated circuits or packages. The circuit 100 further includes a plurality of conductive strip conductors 150 and 160 for electrically coupling the various components. In particular, component 120 is electrically connected to component 130 by conductor 150, and component 130 is electrically connected to component 140 by conductor 160. The respective conductors 150 and 160 may be implemented from metallic layers embedded between insulating layers in the PCB 110.

In accordance with one embodiment of the invention, portions 155 and 165 of the respective conductors 150 and 160 are in contact with a dielectric fluid 170 circulating through a fluid channel 180 formed in the PCB 110. In particular, the channel 180 may be formed by a series of interconnected segments that allow passage of the dielectric fluid 170 to flow through the PCB 110. The portions of the channel illustrated in FIG. 4 as horizontal segments may be formed by removing a volume of bulk material from the corresponding layer of the PCB 110 during the manufacturing or assembly process. The portions of the channel 180 illustrated as vertical segments may be formed by coincident layer-to-layer vias. Interconnection of a horizontal segment with a vertical segment 205 can be made by having a via on one PCB layer coincide with a horizontal segment on an adjacent layer.

The channel 180 includes a sealable inlet port 190 for adding fluid, and a sealable outlet port 195 for removing fluid, respectively. The inlet and outlet ports 190 and 195 allow for the dielectric properties of the fluid 170 to be varied at any time during the life of the circuit 100. For example, changes in circuit performance due to aging or heating may be compensated for by changing a dielectric property (e.g., the dielectric constant) of the fluid 170. In the illustrated embodiment, the dielectric constant of the fluid 170 may be varied by adding dielectric fluid having a lower or higher dielectric constant than the fluid in the channel 180 through the inlet port 190, while simultaneously removing fluid from the channel 180 through the outlet port 195, until the desired circuit performance is achieved. The dielectric fluid 170, which may be a gas or a liquid, is preferably fully contained by the PCB 110. In order to prevent leakage of the fluid 170, the respective strip conductor portions 155 and 165 preferably form sealed portions of the channel 180.

Towards this end, it may be desirable to mixing two or more fluids of different dielectric constants to produce a fluid mixture having a desired dielectric constant to achieve a desired performance characteristic of the electrical circuit 100. In one embodiment, the two or more fluids include a first fluid having a greater dielectric constant, and a second fluid having a lower dielectric constant, respectively, than an anticipated dielectric constant needed in for the mixture to achieve a desired circuit performance characteristic. The fluids are preferably mixed in variable proportions so that the overall dielectric property of the mixture may also be varied during the life of the electrical circuit 100, e.g., to compensate for such as aging or temperature change. In one embodiment, feedback control is used to determine a desired dielectric constant of the mixture.

While preferred embodiments and applications have been shown and described, as can be appreciated by those of ordinary skill in the art, the invention can be embodied in other specific forms without departing from the inventive concepts contained herein. The presently disclosed embodiments, therefore, should be considered as illustrative, not restrictive.

For example, there may be multiple dielectric fluid channels provided for contact with various conductors in a PCB. Further, there may be certain conductors not in contact with the dielectric fluid, and some conductors may have a greater amount of surface area exposed to the dielectric fluid and, hence, be more dependent on the dielectric property of the fluid than other conductors, depending on circuit design considerations.

Accordingly, the invention should not be limited except by the scope of the appended claims and their equivalents.

What is claimed is:

1. A printed circuit board (PCB) carrying an electrical circuit, the PCB comprising a channel for carrying a dielectric fluid, the electrical circuit comprising a conductor having a surface forming a portion of the channel, whereby a dielectric property of a fluid in the channel effects one or more transmission line characteristics of the conductor.

2. The PCB of claim 1, wherein the PCB is a multilayer PCB, and wherein the channel is formed by removal of portions of one or more layers of the PCB.

3. The PCB of claim 1, wherein the PCB is a multilayer PCB, and wherein the channel is formed by coinciding vias in adjacent layers of the PCB.

4. The PCB of claim 1, wherein the dielectric fluid is a gas.

5. The PCB of claim 1, wherein the dielectric fluid is a liquid.

6. The PCB of claim 1, wherein the one or more transmission characteristics include at least one of signal transmission rate, delay time and propagation wavelength.

7. A printed circuit board (PCB) device, comprising:

one or more channels for carrying a dielectric fluid; and an electrical circuit including a plurality of conductors, each of the plurality of conductors having a surface in fluid communication with the one or more channels such that a dielectric property of a fluid carried in the one or more channels effects one or more transmission line characteristics of the respective conductors.

8. The PCB device of claim 7, wherein the PCB is a multi-layer PCB and comprises a plurality of channels, at least one channel being formed by removal of portions of one or more layers of the PCB, and at least one channel comprising coinciding vias in adjacent layers of the PCB.

9. The PCB device of claim 7, wherein the one or more transmission characteristics include at least one of signal transmission rate, delay time and propagation wavelength.

10. An assembly, comprising:

a printed circuit board (PCB) carrying an electrical circuit; and a reservoir for carrying a dielectric fluid, the electrical circuit comprising a conductor having a surface in fluid communication with the reservoir, whereby a dielectric property of a fluid in the reservoir effects one or more transmission line characteristics of the conductor.

11. The assembly of claim 10, wherein the one or more transmission characteristics include at least one of signal transmission rate, delay time and propagation wavelength.

12. A method of tuning an electrical circuit carried in a printed circuit board (PCB), the PCB comprising a channel for carrying a dielectric fluid, the electrical circuit comprising a strip conductor having a surface forming a portion of the channel, the method comprising:

(a) measuring a performance characteristic of the electrical circuit; and (b) inserting a fluid having a dielectric property into the channel, the fluid contacting the strip conductor surface.

13. The method of claim 12, wherein step (a) is performed before step (b), the method further comprising (c) measuring the performance characteristic after the dielectric fluid is inserted in the channel; and (d) varying the dielectric property of the fluid based on the measurement taken in step (c).

14. The method of claim 13, wherein steps (c) and (d) are repeated in an iterative process until a desired performance characteristic of the electrical circuit is achieved.

* * * * *